(12) United States Patent
Nishizawa et al.

(10) Patent No.: US 9,482,693 B2
(45) Date of Patent: Nov. 1, 2016

(54) CAPACITIVE SENSOR SHEET AND PRODUCTION METHOD THEREOF

(75) Inventors: Koji Nishizawa, Saitama (JP); Yusuke Kobayashi, Saitama (JP); Hiroto Komatsu, Saitama (JP)

(73) Assignee: SHIN-ETSU POLYMER CO., LTD. (JP)

( * ) Notice: Subject to any disclaimer, the term of this patent is extended or adjusted under 35 U.S.C. 154(b) by 761 days.

(21) Appl. No.: 13/876,098

(22) PCT Filed: Feb. 3, 2012

(86) PCT No.: PCT/JP2012/052499
§ 371 (c)(1),
(2), (4) Date: Mar. 26, 2013

(87) PCT Pub. No.: WO2012/105690
PCT Pub. Date: Aug. 9, 2012

(65) Prior Publication Data
US 2013/0181727 A1     Jul. 18, 2013

(30) Foreign Application Priority Data

Feb. 4, 2011   (JP) ................................. 2011-022850

(51) Int. Cl.
*G06F 3/044* (2006.01)
*G01R 1/02* (2006.01)
*G01R 3/00* (2006.01)

(52) U.S. Cl.
CPC . *G01R 1/02* (2013.01); *G01R 3/00* (2013.01); *G06F 3/044* (2013.01); *G06F 2203/04103* (2013.01)

(58) Field of Classification Search
CPC ....................................................... G01B 7/28
See application file for complete search history.

(56) References Cited

U.S. PATENT DOCUMENTS

2009/0200148 A1*   8/2009   Honmatsu ............. G06F 3/0213
                                                                 200/5 A
2010/0102027 A1   4/2010   Liu .................................. 216/13

(Continued)

FOREIGN PATENT DOCUMENTS

CN      101620490 A     1/2010
EP      2 209 064 A1    7/2010

(Continued)

OTHER PUBLICATIONS

European Search Report, dated Oct. 13, 2014, issued in corresponding European Patent Application No. 12742713.6. Total 8 pages.

(Continued)

*Primary Examiner* — Kenneth Bukowski
(74) *Attorney, Agent, or Firm* — Ostrolenk Faber LLP

(57) ABSTRACT

A production method of a capacitive sensor sheet, comprising: a film forming step forming of a optically-transparent electroconductive film 11 on the surface of a substrate 2 having optical transparency; a supplemental electrode forming step of setting an electrode region 3a which functions as the transparent electrode 3 at least in part of the film 11, and laminating a supplemental electrode 4a which has a lower electrical resistance than the electrical resistance of the film 11 to cover at least part of a periphery of the electrode region 3a; a wire forming step of laminating a wire 4b in which one end thereof is connected to the supplemental electrode 4a on the film 11; a resist laminating step of laminating a resist 12 to cover all of the electrode region 3a and at least part of the supplemental electrode 4a; and a conductive film removing step of removing a part of the film 11 formed on the substrate 2 having optical transparency placed at a position not overlapping with the resist 12, the supplemental electrode 4a, or the wire 4b.

8 Claims, 10 Drawing Sheets

(56) References Cited

U.S. PATENT DOCUMENTS

2011/0099805 A1  5/2011  Lee .................................. 29/846
2012/0258334 A1* 10/2012 Kaneko .................. G06F 3/044
                                                        428/701

FOREIGN PATENT DOCUMENTS

| | | |
|---|---|---|
| JP | 2006-266695 | 10/2006 |
| JP | 2008-233976 | 10/2008 |
| JP | 2009-026639 | 2/2009 |
| JP | 2010-040424 | 2/2010 |
| KR | 100908101 B1 | 7/2009 |
| KR | 10-2010-0095989 A | 9/2010 |
| WO | WO 2010/029979 | 3/2010 |
| WO | WO 2010/095798 A1 | 8/2010 |

OTHER PUBLICATIONS

International Search Report and Written Opinion mailed May 1, 2012 in corresponding PCT International Application No. PCT/JP2012/052499.

Office Action dated May 12, 2015 issued in corresponding Chinese Patent Application No. 201280003659.1 (with English translation).

\* cited by examiner

CAPACITIVE SENSOR SHEET AND PRODUCTION METHOD THEREOF

CROSS-REFERENCE TO RELATED APPLICATIONS

The present application is a 35 U.S.C. §§371 national phase conversion of PCT/JP2012/052499, filed Feb. 3, 2012, which claims priority to Japanese Patent Application No. 2011-022850, filed Feb 4, 2011, the contents of which are incorporated herein by reference. The PCT International Application was published in the Japanese language.

TECHNICAL FIELD

The present invention relates to a capacitive sensor sheet having transparent electrodes.

BACKGROUND ART

In the past, various types of sensor sheets which detect a user's finger touch have been examined to improve the interface of an information terminal. For example, a sensor which detects variation of capacitance between the sensor and a human finger by using capacitance detection means is disclosed in Patent Document 1.

In the sensor disclosed in Patent Document 1, a supplemental electrode having lower electrical resistance than a transparent electrode is placed at least partly around the transparent electrode. The sensor disclosed in Patent Document 1 may reduce variation in detection sensitivity.

DOCUMENTS OF THE PRIOR ART

Patent Documents

[Patent document 1] Japanese Unexamined Patent Application, First Publication No. 2006-266695

DISCLOSURE OF THE INVENTION

Problems to be Solved by the Invention

However, in the sensor described in Patent Document 1, when the transparent electrode and the supplemental electrode are misaligned in the production process, the size of the conduction area between the transparent electrode and the supplemental electrode might vary depending on the degree of the misalignment. There is a problem that the process may be cumbersome and complicated when the transparent electrode and the supplemental electrode are aligned with high accuracy to prevent the variation in the conduction area.

The present invention takes the above circumstances into consideration, and has an object of providing a capacitive sensor sheet which is suppressed the degree of variation in the conduction area between the transparent electrode and the supplemental electrode and a production method thereof.

Means for Solving the Problem

A production method of a capacitive sensor sheet of the present invention comprises: a film forming step of forming an optically-transparent electroconductive film on at least one surface of a substrate having optical transparency; a supplemental electrode forming step of setting an electrode region which functions as the transparent electrode at least in part of the optically-transparent electroconductive film, and laminating a supplemental electrode which has lower electrical resistance than the electrical resistance of the optically-transparent electroconductive film to cover at least part of a periphery of the electrode region; a wire forming step of laminating a wire which one end thereof is connected to the supplemental electrode on the optically-transparent electroconductive film; a resist laminating step of laminating a resist to cover all of the electrode region and at least part of the supplemental electrode; and an electroconductive film removing step of removing a part of the optically-transparent electroconductive film formed on the substrate having optical transparency placed at a position not overlapping with the resist, the supplemental electrode, or the wire.

Moreover, it is preferable for the electoroconductive film removing step to remove the optically-transparent electroconductive film by plasma etching; and the production method of the present invention may further comprise a resist removing step of removing the resist after the electroconductive film removing step.

Moreover, it is preferable for the resist laminating step to laminate an optically-transparent resist as the resist.

A capacitive sensor sheet of the present invention comprises: a substrate having optical transparency; a transparent electrode comprising an optically-transparent electroconductive film formed on at least one surface of the substrate; and a supplemental electrode which is a film-shaped electrode laminated on the periphery of the transparent electrode and having a lower electrical resistance than the electrical resistance of the transparent electrode, wherein at least a part of a contour of the supplemental electrode thereof is positioned on a contour of the transparent electrode as viewed from a direction that is perpendicular to the surface.

Moreover the capacitive sensor sheet of present invention further comprises: a wire laminated on the optically-transparent electroconductive film and one end thereof is connected to the supplemental electrode; and an optically-transparent resist which covers at least part of the electrode region and at least part of the supplemental electrode, wherein a contour of the optically-transparent resist may be positioned on a contour of the transparent electrode not covered by the supplemental electrode as viewed from a direction that is perpendicular to the surface.

Moreover, the optically-transparent resist may comprise a thermo-setting polyester resin.

Moreover, at least part of the wire may be covered by the optically-transparent resist.

Moreover, the transparent electrode is provided on both surfaces of the substrate, the capacitive sensor sheet further comprises a film-shaped supplemental electrode laminated on a periphery of the transparent electrode and having a lower electrical resistance than the electrical resistance of the transparent electrode, and the supplemental electrode may be provided at a position at which a part of a contour thereof is placed on a contour of the transparent electrode as viewed from a direction that is perpendicular to the surface.

Effects of the Invention

According to the capacitive sensor sheet and the method of producing thereof in present invention, it can be suppressed the degree of variation in the conduction area between the transparent electrode and the supplemental electrode.

DESCRIPTION OF EMBODIMENTS (First Embodiment)

A capacitive sensor sheet 1 and a production method thereof according to a first embodiment of the present invention will now be described.

Figure 1:
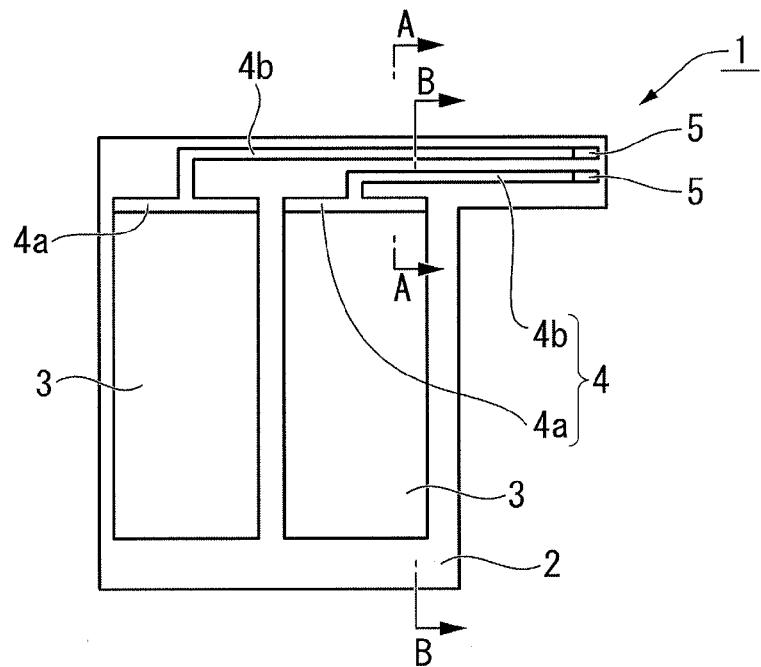
FIG. 1 is a plan view showing a capacitive sensor sheet according to a first embodiment of the present invention.
Figure 2:
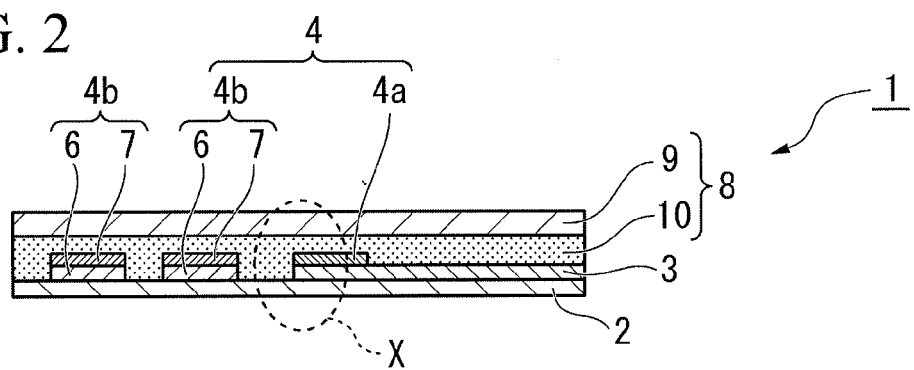
FIG. 2 is a cross-sectional view taken along a line A-A in FIG. 1.
Figure 3:
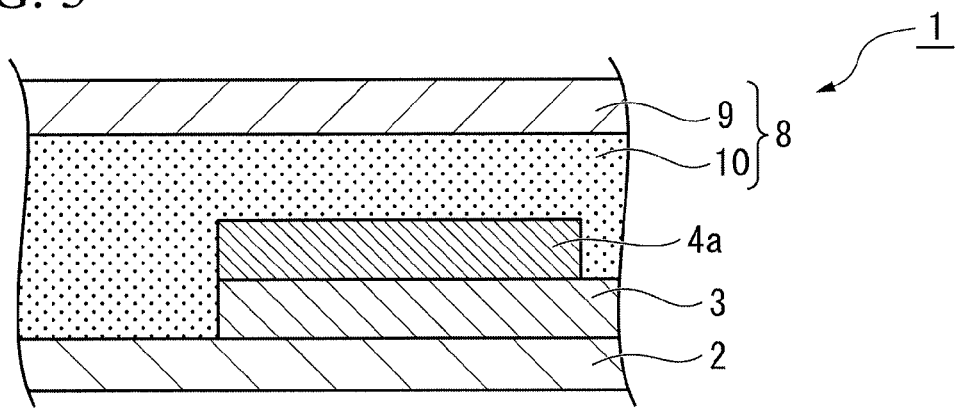
FIG. 3 is an enlarged view showing a part in FIG. 2.

First of all, a constitution of a capacitive sensor sheet 1 of the embodiment will be described with reference made to FIG. 1, FIG. 2, and FIG. 3. FIG. 1 is a plan view showing a capacitive sensor sheet 1 according to the embodiment. FIG. 2 is a cross-sectional view taken along a line A-A in FIG. 1. FIG. 3 is an enlarged view showing a part marked by reference Symbol (X) in FIG. 2. In addition, cover film 8 is not illustrated in FIG. 1.

Capacitive sensor sheet 1 is able to use as touch-sensitive input device of liquid crystal display, for example.

As is shown in FIG. 1 and FIG. 2, capacitive sensor sheet 1 comprises substrate 2, transparent electrode 3, signal line 4, and cover film 8.

The substrate 2 is a film-, sheet-, or plate-shaped insulating material having optical transparency. Hard materials such as polyethylene terephthalate—(PET), polycarbonate, acrylic resin; and elastic materials such as thermoplastic polyurethane, thermosetting polyurethane, and silicone rubber are suitable for material of the substrate 2.

As possible example of hard materials of the substrate 2 are resinous material such as polyethylene naphthalate, polyethylene, polypropylene, polystyrene, polyvinyl chloride, polyvinyl alcohol, polybutylene terephthalate, polyvinylidene fluoride, and polyarylate, and so on. In these resinous materials, polyethylene terephthalate is more suitable as a material of the substrate 2 from the view of the strength. In addition, glasses and optically-transparent metal oxides may be adopted as a material of the substrate 2.

Thickness of the substrate 2 may be 10 to 200 μm. When the thickness of the substrate 2 is 10 μm or more, the substrate 2 may be hard to brake. When the thickness of the substrate 2 is 200 μm or less, the thickness of the capacitive sensor sheet 1 can be thinner.

The transparent electrode 3 is formed in the shape of a rectangle on the substrate 2 by printing or applying the conducting materials having optical transparency: these conducting materials may be conductive polymer like ITO (indium tin oxide), FTO (fluorine doped tin oxide), polythiophene and polyanilin.

Preferred material of the transparent electrode 3 is, for example, conductive ink of polythiophene (e.g. "SEPLEGYDA" (trademark) manufactured by Shin-Etsu Polymer Co., Ltd.). In addition, film containing metals or metallic oxide (e.g. gold, silver, copper, and ITO), ink containing metallic nanowire or carbon nanotube may be possible as material of the transparent electrode 3, although the transparencies of these materials are less than SEPLEGYDA (trademark).

Concrete examples of conductive polymer adoptable as materials for the transparent electrode 3 are polypyrrole, poly-N-methylpyrrole, poly-3-methylthiophene, poly-3-methoxythiophene and poly-3,4-ethylenedioxythiophene.

When the transparent electrode 3 is formed by printing or applying, it is preferable for the thickness of the conductive coating of transparent electrode 3 to be 0.05 to 5 μm: it is more preferable for the thickness of the conductive coating to be 0.1 to 1 μm. When the thickness of the conductive coating is at least 0.05 μm, conductivity of the transparent electrode 3 is provided enough. When the thickness of the conductive coating is at least 0.1 μm, surface resistance of the transparent electrode 3 is stably less than 600 Ω/sq which provides enough detectivity. When the thickness of the conductive coating is at most 5 μm, it is easy to form the coating.

The signal line 4 has a supplemental electrode 4a which connected to the transparent electrode 3 and a wire 4b which one end thereof is connected to the supplemental electrode 4a.

The supplemental electrode 4a is a film-shaped electrode laminated on a part of periphery of the transparent electrode and having a lower electrical resistance than the transparent electrode 3. For example, when using ink containing metallic silver particles as a material of supplemental electrode 4a, the surface resistance of the supplemental electrode 4a is no more than 1 Ω/sq. When using carbon containing ink as a material of supplemental electrode 4a, the surface resistance of the supplemental electrode 4a is no more than 150 Ω/sq.

As is shown in FIG. 1 and FIG. 3, the shape of supplemental electrode 4a is rectangle as viewed from a direction that is perpendicular to the surface of the substrate 2. A part of a contour of the supplemental electrode 4a is positioned on a contour of the transparent electrode 3 as viewed from a direction that is perpendicular to the surface of the substrate 2.

The supplemental electrode 4a is laminated on a periphery of the transparent electrode 3, and adhered to the transparent electrode 3 so that transparent electrode 3 and supplemental electrode 4a are in electrically conductible condition. Ink containing metallic particle like silver, copper, or gold; ink containing carbon or graphite; and metallic foil are adoptable as the material of the supplemental electrode 4a.

By including a first layer 6 which is formed from the same material of the transparent electrode 3 and a second layer 7 which has lower electrical resistance than the transparent electrode 3, the wire 4b has lower electrical resistance than the transparent electrode 3. In this embodiment, the second layer 7 of the wire 4b is made from the same material of the supplemental electrode 4a. As is shown in FIG. 1, one end of the wire 4b is connected to the supplemental electrode 4a, the other end of the wire 4b is elongated to the periphery of the substrate 2. Connecting pad 5 made from gold or carbon is provided at the other end of the wire 4b. Connecting pad 5 is exposed outside and is used for connecting to a not illustrated detector circuit.

As is shown in FIG. 2, the cover film 8 is a film which has the adhesive 10 on one surface of the optical transparent resin film 9. For example, photosensitive dry film, ultraviolet cure resist material, and thermo-setting resist material are available for the material of the cover film 8. The cover film 8 is formed in a shape to cover both the transparent electrode 3 and signal line 4. In this embodiment, the cover film 8 is formed as a rectangle.

The resin film 9 which is constituted the cover film 8 may be made from, for example, resin material like polyethylene terephthalate (PET), polycarbonate, acrylic resin, polyethylene naphthalate, polyethylene, polypropylene, polystyrene, polyvinyl chloride, polyvinyl alcohol, polybutylene terephthalate, polyvinylidene fluoride, and polyarylate. It is possible that the cover film 8 has another film made from glass or optically-transparent metal oxid, instead of or in addition to the resin film 9.

The concrete example of the adhesive 10 is acrylic resin.

The production method of the capacitive sensor sheet in this embodiment will now be described using an example of steps to produce the capacitive sensor sheet 1 which has above described components.

Figure 4:
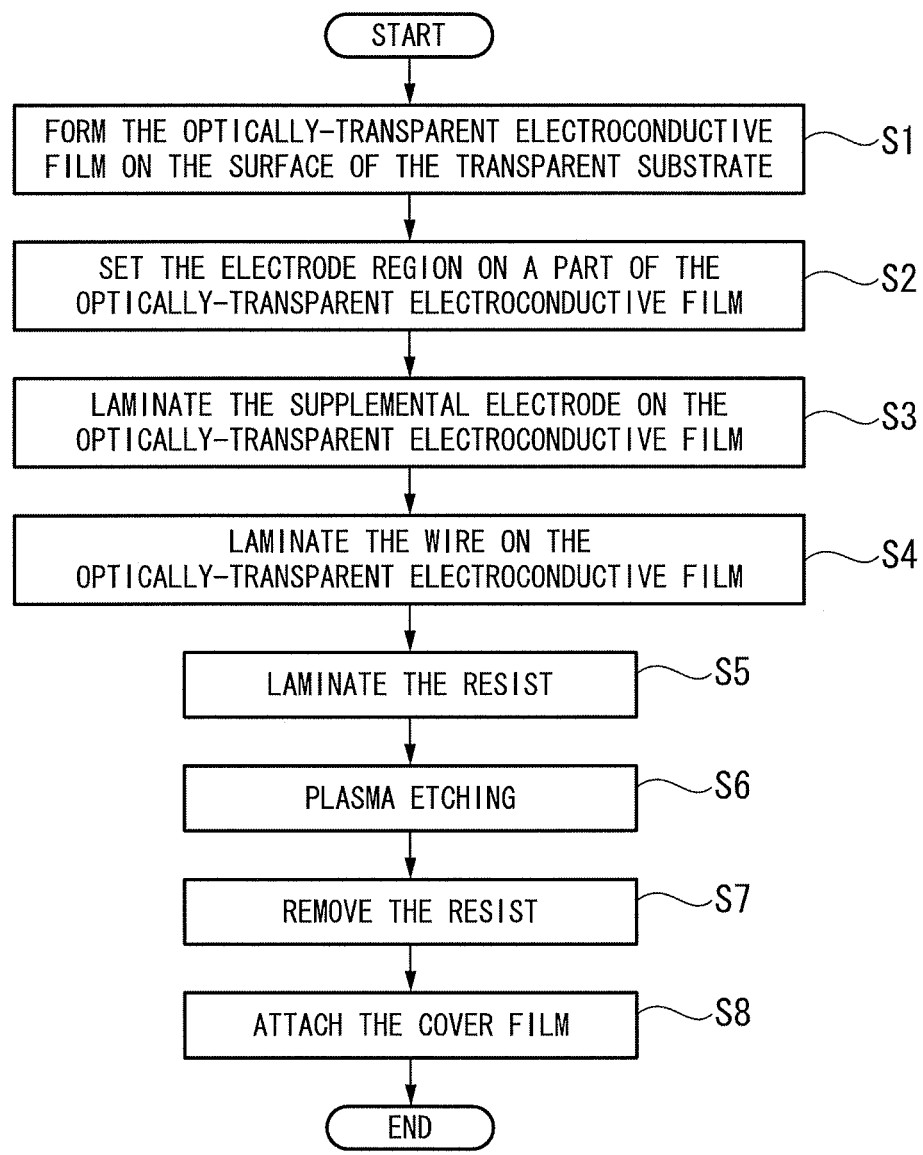
FIG. 4 is a flowchart showing a production method of a capacitive sensor sheet according to a first embodiment of the present invention.

FIG. 4 is a flowchart showing a production method of a capacitive sensor sheet 1 according to a first embodiment of the present invention. FIG. 5 to FIG. 9 are a diagram to explain the step to produce the capacitive sensor sheet 1 by the production method in this embodiment.

Figure 5:
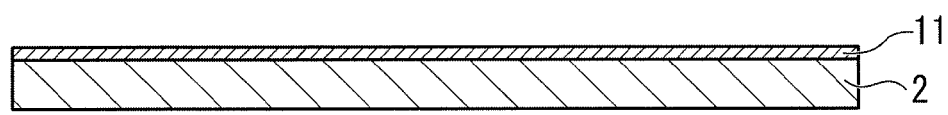
FIG. 5 is a diagram to explain the production method of above embodiment.

To produce the capacitive sensor sheet 1, at first, as is shown in FIG. 5, it is performed that a thin film 11 of SEPLEGYDA (trademark) is coated on one surface of the optically transparent substrate 2 ("film forming step" as step S1 in FIG. 4). Note that the thin film 11 is an optically-transparent electroconductive film in this embodiment.

In the step S1, a solution of SEPLEGYDA (trademark) is applied on one surface of the substrate 2 by coating or printing. A known coating method using a gravure coater, a die coater, a bar coater, or a roll coater may be selected and adopted as the method to coat with SEPLEGYDA (trademark). In addition, known printing method using gravure printing or offset printing may be selected and adopted as the printing method of the solution of SEPLEGYDA (trademark). In the step S1, the solution of SEPLEGYDA (trademark) is applied on the entire surface of the one surface of the substrate 2. The applied solution of SEPLEGYDA (trademark) on the substrate 2 forms thin film by hardening process using heat drying or ultraviolet rays.

The step S1 is now finished and advances to the signal line forming step.

Figure 6:
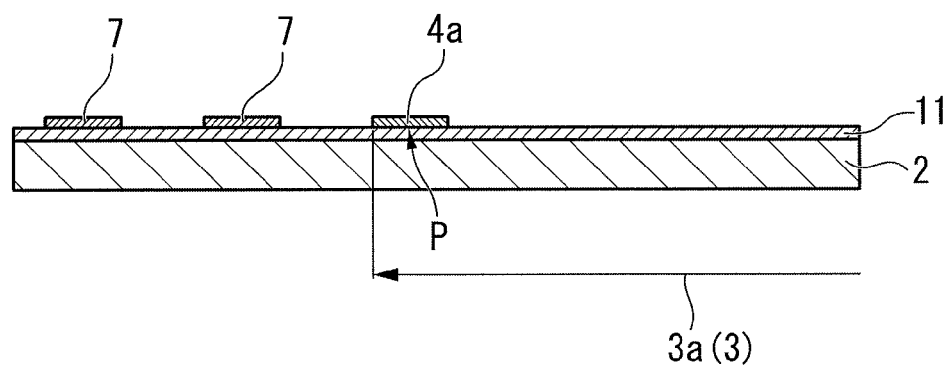
FIG. 6 is a diagram to explain the production method of above embodiment.

As is shown in FIG. 6, the signal line forming step is the step that sets the electrode region 3a which works as the transparent electrode 3 at least in part of the thin film 11 of SEPLEGYDA (trademark) (step S2 in FIG. 4); and that form the second layer 7 which is part of the wire 4b, and the supplemental electrode 4a to fit in the place of the electrode region 3a (step S3 and step S4 in FIG. 4).

Note that, in this embodiment, the electrode region 3a contains the supplemental electrode 4a. The area of electrode region 3a except the part which the supplemental electrode 4a was formed is a transparent area having optical transparency. The transparent area is an area which passes the illumination light to illuminate the capacitive sensor sheet 1.

The electrode region 3a which is set in the signal line forming step may be set under the condition of the position and shape of the transparent electrode 3 after the production step of the capacitive sensor sheet 1-. Moreover, supplemental electrode 4a may be positioned in the electrode region 3a, and supplemental electrode 4a may be formed to cover at least a part of the periphery of the electrode region 3a.

Moreover, in this embodiment, the second layer 7 is printed on the thin film of SEPLEGYDA (trademark) as a pattern which is connected to the supplemental electrode 4a. In this embodiment, that pattern of the supplemental electrode 4a and second layer 7 is made in the same step by screen printing of silver paste.

In this embodiment, in the signal line forming step, both the supplemental electrode forming step of forming the supplemental electrode 4a (step S3 in FIG. 4) and the wire forming step of forming the wire 4b (step S4 in FIG. 4) are performed in the same step.

Moreover, after the second layer 7 is formed in the signal line forming step, connecting pad 5 (see FIG. 1) is formed on the second layer 7.

Note that in the signal line forming step, alignment marks for trimming of outline of the capacitive sensor sheet 1 may be formed using the same material of second layer 7.

The signal line forming step is now finished and advances to the resist laminating step (step S5 in FIG. 4).

The resist laminating step is a step laminating a resist 12 on the substrate 2 on which the signal line 11 and the thin film of SEPLEGYDA (trademark) were formed.

Figure 7:
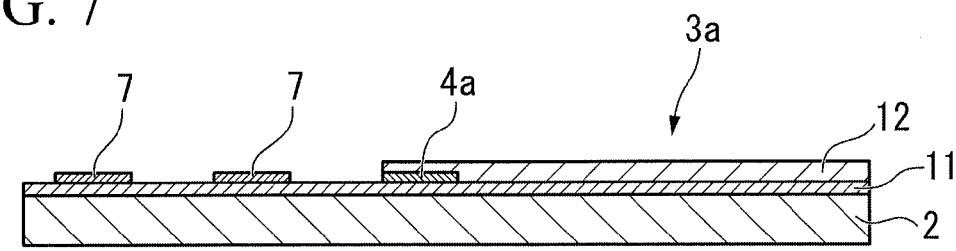
FIG. 7 is a diagram to explain the production method of above embodiment.

As is shown in FIG. 7, in the resist laminating step, resist 12 is laminated on the electrode region 3a to cover the entire electrode region 3a. In this embodiment, because the supplemental electrode 4a is provided in the electrode region 3a, resist 12 covers the supplemental electrode 4a in addition. The resist 12 used in the resist laminating step has resistance to the plasma etching process. Specifically in this embodiment, resin film which is applied the adhesive is used as the resist 12, and by cutting the resin film into a predetermined pattern and then attaching to the electrode region 3a, a layer of the resist 12 is formed. Note that the resist 12 may be made by screen printing of the patterned removable masking materials which may remove after hardening.

The concrete example of the material of the resist 12 is thermo-setting resin (e.g. polyester resin, and urethane resin). In addition, another concrete example of materials of the resist 12 is thermoplastic resin (e.g. polyester resin, vinyl resin, polyester-urethane resin, and acrylic resin). Moreover, in the resist laminating step, a masking plate made from a metallic plate like a dry film and aluminum with slits made by laser or a punching process may be used.

When the alignment marks were made by a material which contains metals, metals in the alignment marks may run hot by the plasma etching process in the electroconductive film removing step described below. To prevent contact of the plasma with the alignment marks, resist 12 may be laminated on the alignment marks.

The resist laminating step is now finished and advances to the electroconductive film removing step (step S6 in FIG. 4).

The electroconductive film removing step is a step removing part of the thin film 11 of SEPLEGYDA (trademark) from the substrate 2 which the thin film 11 of SEPLEGYDA (trademark), the signal line 4, and the resist 12 were formed.

Figure 8:
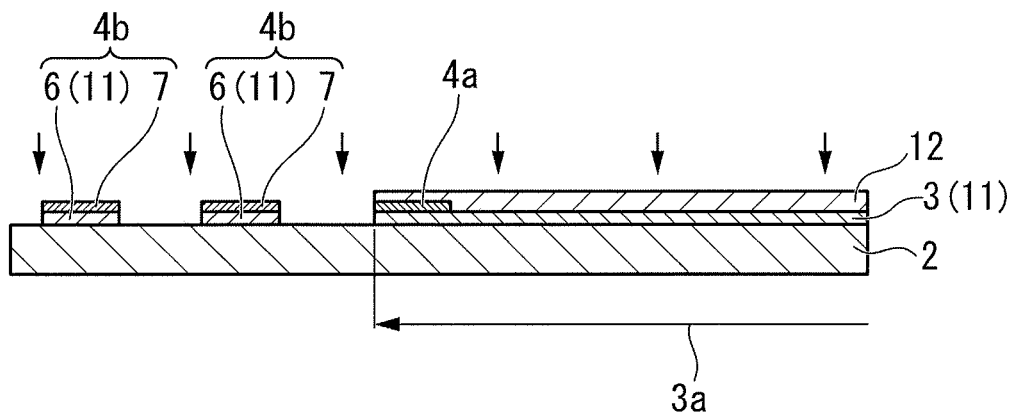
FIG. 8 is a diagram to explain the production method of above embodiment.

As is shown in FIG. 8, in the electroconductive film removing step, thin film 11 of SEPLEGYDA (trademark) formed on the substrate 2 placed at a position not overlapping with resist 12, supplemental electrode 4a, and second layer 7 is removed using the plasma etching process. After the electroconductive film removing step, thin film 11 of SEPLEGYDA (trademark) at the electrode region 3a comes to the transparent electrode 3. Moreover, after the electroconductive film removing step, thin film 11 of SEPLEGYDA (trademark) overlapped with second layer 7 comes to the first layer 6 having the same pattern of second layer 7. In this way, wire 4b is made from the first layer 6 and the second layer 7.

The electroconductive film removing step is now finished and advances to the resist removing step (step S7 in FIG. 4).

Figure 9:
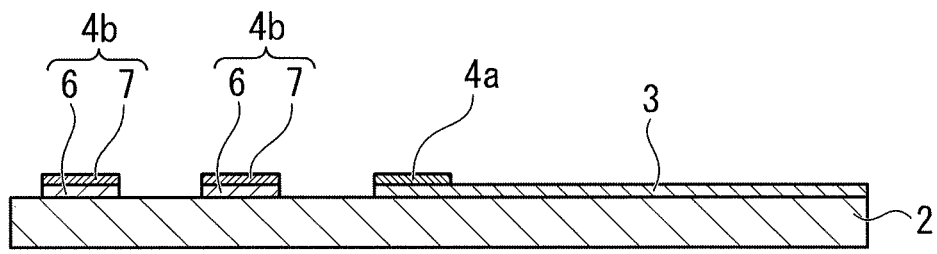
FIG. 9 is a diagram to explain the production method of above embodiment.

As is shown in FIG. 9, the resist removing step is a step removing the resist 12 after the electroconductive film removing step. In this embodiment, resist 12 are removed by peeling off the attached resist 12.

The resist removing step is now finished and advances to the cover film attaching step (step S8 in FIG. 4).

As is shown in FIG. 2, the cover film attaching step is a step attaching the cover film 8 described above to the substrate 2 on which the transparent electrode 3 and the signal line 4 are formed.

The transparent electrode 3 and the signal line 4 is covered by the cover film 8 in the cover film attaching step, and the connecting pad 5 is exposed outside, so that the signal line 4 and the transparent electrode 3 is protected.

The cover film attaching step is now finished and the steps to produce the capacitive sensor sheet 1 are finished.

Next, the operation of the capacitive sensor sheet 1 in this embodiment will be described.

The transparent electrode 3 is formed by the removing of part of the thin film 11 of SEPLEGYDA (trademark) in the electroconductive film removing step after the formation of the signal line 4 on the thin film 11 of SEPLEGYDA (trademark). If the position of the whole pattern of the signal line 4 is misaligned from the substrate 2 when the signal line 4 is formed on the optically-transparent electroconductive film, the conductive area between the transparent electrode 3 and the supplemental electrode 4a are predetermined value regardless of the existence of the misalignment or the degree of the misalignment of supplemental electrode 4a occurring in the signal line forming step.

Moreover, when the outline of the substrate 2 is trimmed using the position of the pattern of the signal line 4 as the basis for trimming, the capacitive sensor sheet 1 is produced without the misalignment.

According to the capacitive sensor sheet 1 of this embodiment, the degree of the variation in conduction area between the transparent electrode 3 and the supplemental electrode 4a becomes lower, resulting in the lower variation of sensitivity between the products than the sheet-shaped sensor produced by placing the supplemental electrode with a positioning process along with the periphery of the patterned transparent electrode.

Moreover, according to the production method of the capacitive sensor sheet 1 of this embodiment, the precision of alignment of the supplemental electrode 4a and the transparent electrode 3 may be increased by a simple method.

(Second Embodiment)

Next, a capacitive sensor sheet 1 and the production method thereof according to a second embodiment of present invention will be described. Note that the component similar to the capacitive sensor sheet 1 and the production method thereof described in above embodiment 1 will be shown with the same reference symbol of the first embodiment, and the repeating explanation is omitted.

Figure 10:
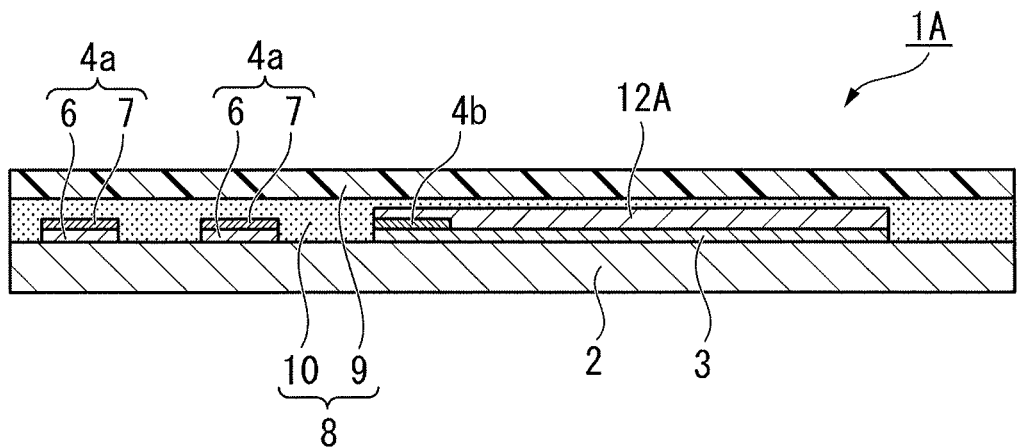
FIG. 10 is a cross-sectional view showing a capacitive sensor sheet according to a second embodiment of present invention taken along a same line B-B in FIG. 1.

FIG. 10 is a cross-sectional view of the capacitive sensor sheet 1A taken along a line B-B in FIG. 1.

As is shown in FIG. 10, the capacitive sensor sheet 1A is different from the above described capacitive sensor sheet 1 in structure in that the capacitive sensor sheet 1A comprises an optically-transparent resist 12A between the transparent electrode 3 and the cover film 8.

The optically-transparent resist 12A is a resist material having resistance against a plasma etching. For example, transparent-adhesive film made from resin may be used as the optically-transparent resist 12A. Transparent insulating ink formed into a patterned shape by screen printing is also possible as the optically-transparent resist 12A. The patterned shaped transparent electroconductive film is also available as the optically-transparent resist 12A.

The concrete examples of material of the optically-transparent resist 12A are thermo-setting resin (e.g. polyester resin, urethane resin, epoxy resin, acrylic resin, and silicone resin, and so on).

The other concrete examples of the optically-transparent resist 12A are solvent evaporation-drying resin (e.g. polyester resin, vinyl resin, polyester-urethane resin, and so on), and light curing resin including visible light curing resin, ultraviolet curable resin, and electron beam curable resin (e.g. acrylic resin and acrylic urethane resin, and so on).

Thermo-setting resin and solvent evaporation-drying resin are suitable materials for the optically-transparent resist 12A because there are few low molecular components after the curing of these materials and these materials hardly affect to the transparent electrode 3.

Total light transmittance of the capacitive sensor sheet 1A having the optically-transparent resist 12A may be 50% or more in the area which the light transmits through the transparent electrode 3. The above described total light transmittance may preferably be 70% or more, and it suitably may be 80% or more When the total light transmittance of the capacitive sensor sheet 1A set high, a visibility is high in case that the capacitive sensor sheet 1A is applied to the touch panels and illuminated touch-pads. In particular, a high level of the total light transmittance is preferable when the sensor area is large like touch panels.

The haze of the capacitive sensor sheet 1A may be 20% or less, preferably 15% or less, suitably 10% or less. When the haze of the capacitive sensor sheet 1A is set low, visibility is high in the case that a display device such as liquid crystal display is placed at the backside of the capacitive sensor sheet.

Next, production method of the capacitive sensor sheet 1A will be described.

Figure 11:
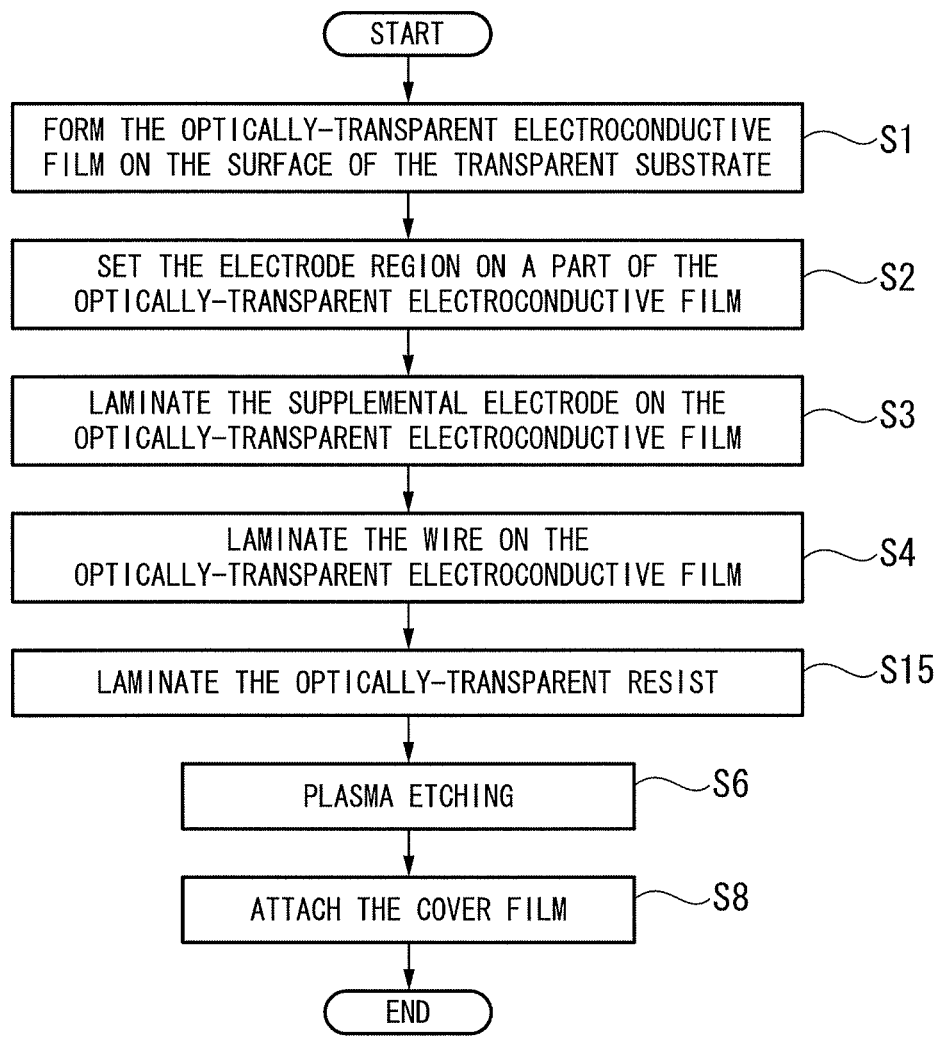
FIG. 11 is a flowchart showing a production method of a capacitive sensor sheet according to the above embodiment.
Figure 12:
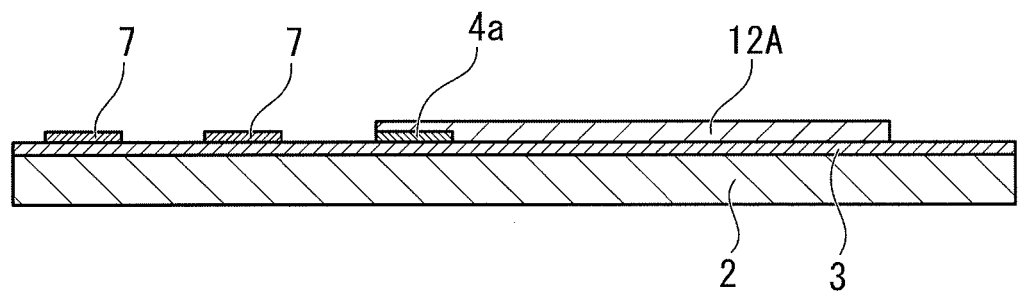
FIG. 12 is a diagram to explain the production method of above embodiment.
Figure 13:
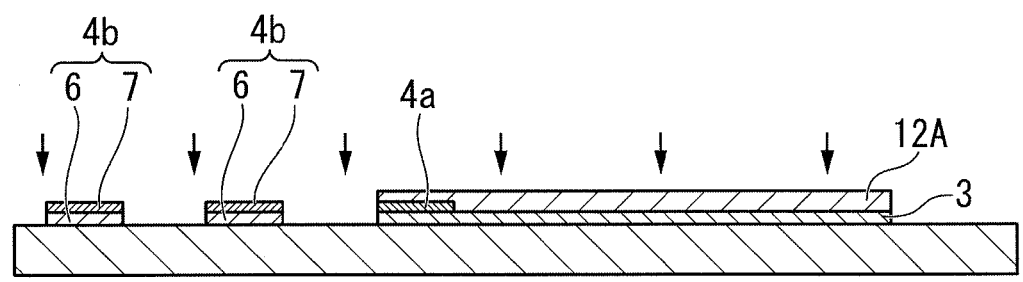
FIG. 13 is a diagram to explain the production method of above embodiment.

FIG. 11 is a flowchart showing a production method of a capacitive sensor sheet 1A according to the embodiment. FIG. 12 and FIG. 13 are figures to explain steps of the production method according to the embodiment.

The production method according to the embodiment comprises a resist laminating step (step S15 in FIG. 11) of laminating the optically-transparent resist 12A in place of the resist laminating step described in the first embodiment. In this embodiment, the production method does not have a step corresponding to the resist removing step (shown as step S7) in the first embodiment.

As is shown in FIG. 12, in the step S15, optically-transparent resist 12A is formed as a layer by attaching the transparent-adhesive film so as to cover at least part of the supplemental electrode 4a and the entire area of the electrode region 3a.

The step S15 is now finished, and, as is shown in FIG. 13, a part of the thin film 11 of SEPLEGYDA (trademark) removed by plasma etching in the same way as the electroconductive film removing step (step S6) described in the first embodiment. Then after the electroconductive film removing step, a cover film 8 is attached in the same way as in the cover film attaching step described in the first embodiment (step S8) under the condition that the optically-transparent resist 12A remains laminated.

The capacitive sensor sheet 1A according to this embodiment has optical transparency as is the capacitive sensor sheet 1 in the first embodiment in which the resist 12 is removed though the optically-transparent resist 12A being attached.

Thus, it is not necessary to remove the optically-transparent resist 12 during the production steps of the capacitive sensor sheet 1A. Accordingly, the number of steps in the production method may be reduced according to this embodiment more than the production method of the capacitive sensor sheet 1 described in the first embodiment.

(Third Embodiment)

Figure 14:
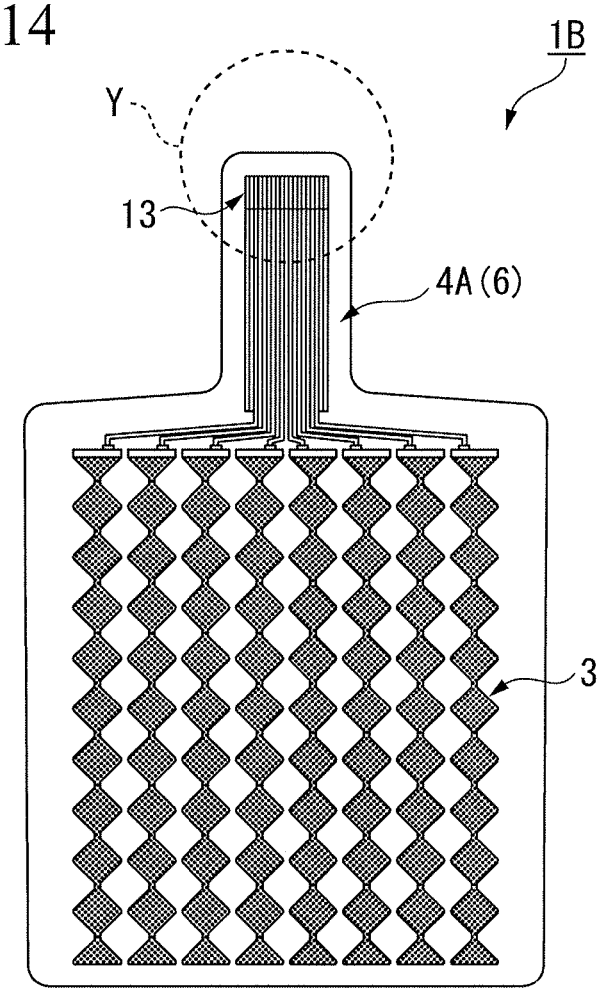
FIG. 14 is a plan view showing a capacitive sensor sheet 1B according to a third embodiment of present invention.
Figure 15:
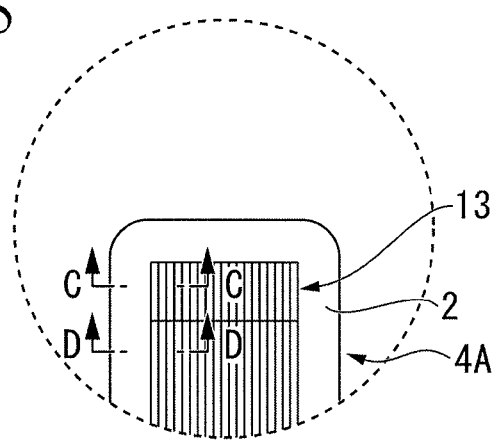
FIG. 15 is an enlarged view of FIG. 14.
Figure 16:
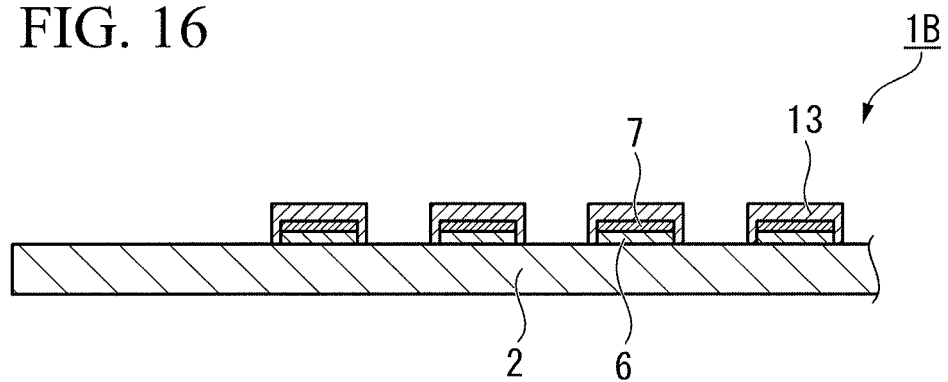
FIG. 16 is a cross-sectional view taken along a line C-C in FIG. 15.
Figure 17:
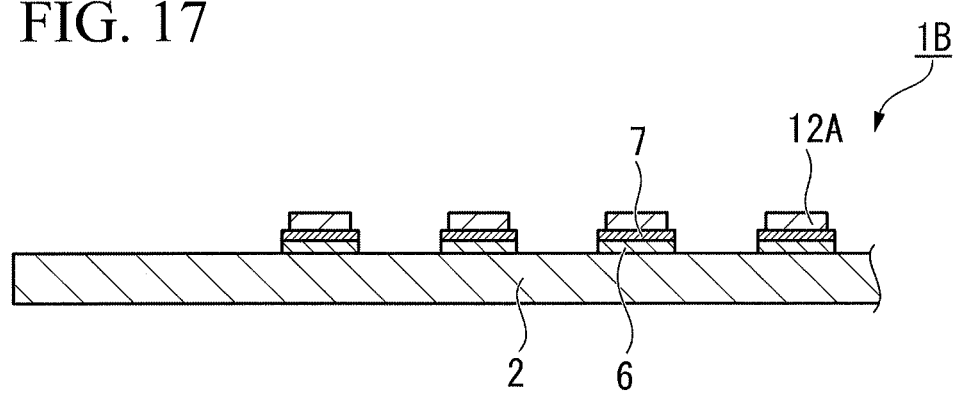
FIG. 17 is a cross-sectional view taken along a line D-D in FIG. 15.

Next, a capacitive sensor sheet 1B according to a third embodiment of present invention will be described. FIG. 14 is a plan view of the capacitive sensor sheet 1B according to the third embodiment. FIG. 15 is an enlarged view of the area figured by Y in FIG. 14. FIG. 16 is a cross-sectional view taken along a line C-C in FIG. 15. FIG. 17 is a cross-sectional view taken along a line D-D in FIG. 15.

As is shown in FIG. 14, the capacitive sensor sheet 1B according to this embodiment comprises a signal line 4A which is routed in a different manner as compared to the signal line 4 described in the above first embodiment. Moreover, as is shown in FIG. 15 to FIG. 17, in this embodiment, the ends of the signal line 4A are placed on the substrate 2 in juxtaposition. The ends of the signal line 4A have connecting pads 13. At least part of the signal line 4A except the area of the connecting pads 13 is covered by the optically-transparent resist 12A in this embodiment.

The connecting pads 13 consist of carbon for example, and the connecting pads 13 are terminals to be connected to a not illustrated connector.

In this embodiment, in case when plasma processing is performed in the electroconductive film removing step, contact between the signal line 4A and the plasma are prevented by the optically-transparent resist 12A. Thus, the signal line 4A hardly heated in the plasma processing even if substances having high heat conductivity are included in the signal line 4A. Accordingly, changes of shape of the substrate 2 hardly occur.

For example, in this embodiment, in case that the signal line 4A is formed wide, and in case that the signal line 4A is densely placed, changes of shape of the substrate 2 hardly occur.

(Forth Embodiment)

Next, a capacitive sensor sheet 1C according to a forth embodiment of present invention will be described.

Figure 18:
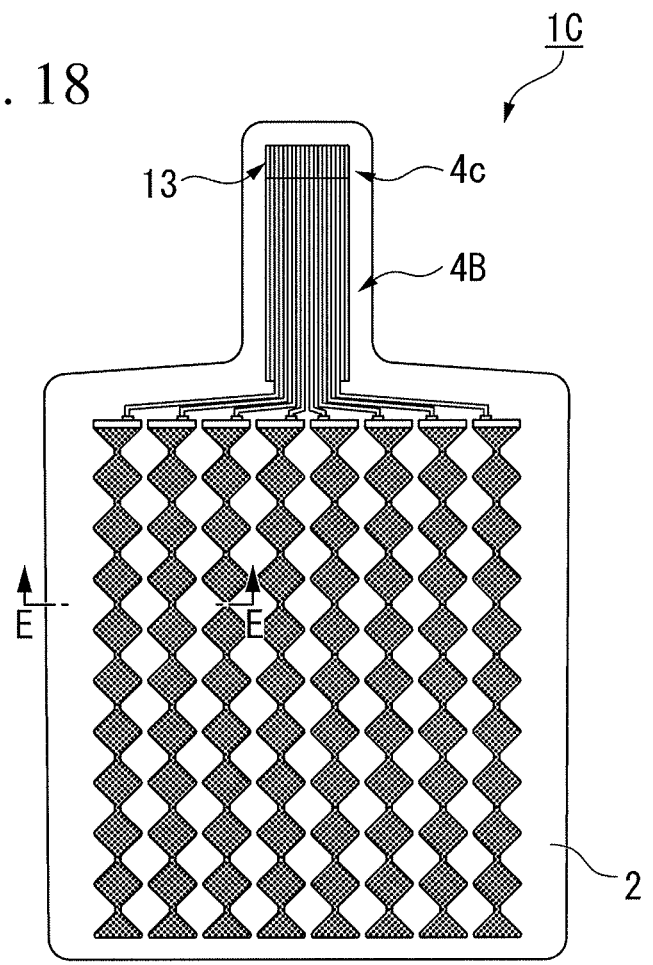
FIG. 18 is a plan view showing a capacitive sensor sheet according to a fourth embodiment of the present invention.
Figure 19:
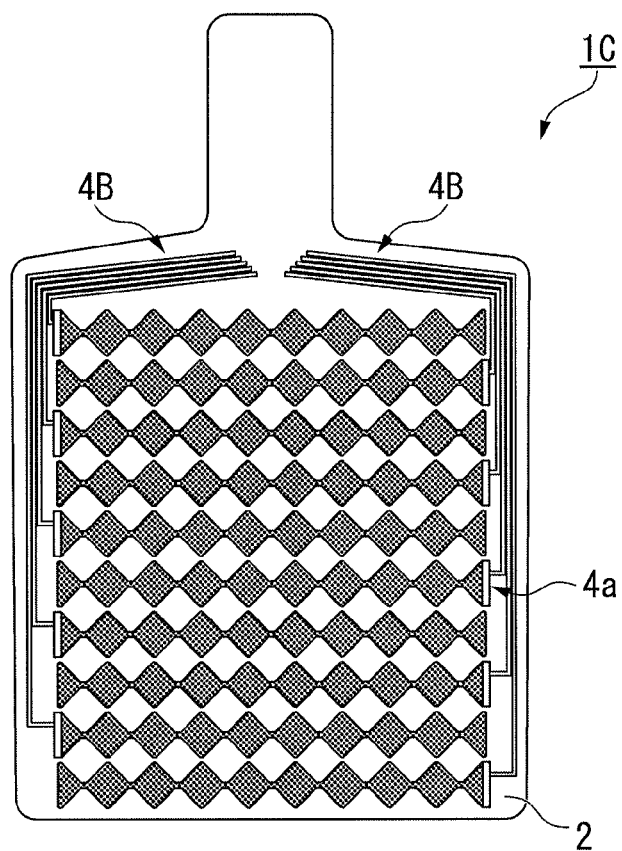
FIG. 19 is a rear view of the capacitive sensor sheet.
Figure 20:
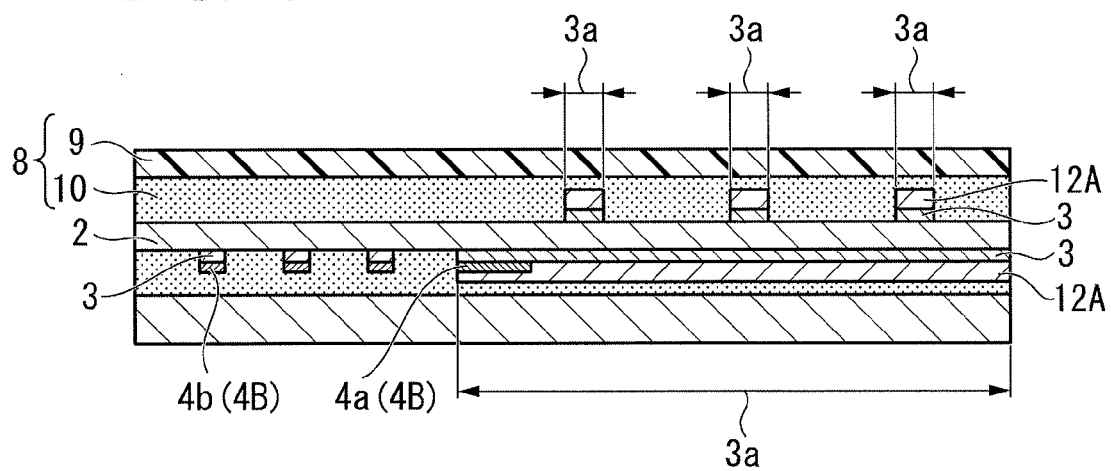
FIG. 20 is a cross-sectional view taken along a line E-E in FIG. 18.

FIG. 18 is a plan view of the capacitive sensor sheet according to this embodiment. FIG. 19 is a backside view of the capacitive sensor sheet. FIG. 20 is a cross-sectional view taken along a line E-E in FIG. 18.

As is shown in FIG. 18 and FIG. 19, the capacitive sensor sheet 1C according to this embodiment comprises a signal lines 4B which is routed in a different manner as compared to the signal line 4 described in the above first embodiment. The capacitive sensor sheet 1C according to this embodiment is different from the second embodiment in that the transparent electrode 3 is provided on both sides of the substrate 2.

Between the supplemental electrode 4a and the end 4c, signal line 4B is routed from one side of the substrate 2 to the other side of the substrate 2 via through holes.

In the case that the capacitive sensor sheet 1C according to this embodiment is produced, as is shown in FIG. 20, first of all, in the step S1 described in the first embodiment, an optically-transparent electroconductive film which is a material of the transparent electrode 3 is formed on both sides of the substrate 2. Then, in the step S2, electrode regions 3a are set at predetermined areas of both sides of the substrate 2. Then, in the step S3 and step S4, supplemental electrode 4a and wire 4b are set at the predetermined positions on the both sides of the substrate 2. Moreover, in the step S15, optically-transparent resists 12A are formed on the both sides of the substrate 2 corresponding to the electrode regions 3a and the supplemental electrode 4a. Then, in the step S6, the optically-transparent electroconductive film is removed by plasma etching performed on each surface. Because the plasma treatment is an anisotropic process, the plasma treatment does not affect the electrodes on the non-treated side.

According to this embodiment, it is easily possible to form the transparent electrode 3 on both sides of the substrate 2.

EXAMPLE 1

Next, the details of the capacitive sensor sheet 1 and the production method thereof will be described using an example. According to the example, the details of the resist laminating step (above step S5), the electroconductive film removing step (above step S6), and the resist removing step (above step S7) will be described.

In the above step S5, metal mask having an opening which has the same pattern as the pattern of the signal line to be obtained is laminated on the surface of the conductive coating which compose the transparent electrode, removable resist material (produced by Asahi Chemical Research Laboratory Co., Ltd., #228T) were printed so that the thickness of the removable resist material is 80 μm, and the removable resist material were heated and hardened at 150° C., for 10 minutes.

Next, in the above step S6, a laminated body which comprises the PET film which is printed the resist material and the conductive coating is inserted in an etching chamber of the plasma etching device (produced by Hitachi High Technologies, SPC-100), and the plasma etching for the conductive coating was performed for two minutes under the condition that the degree of vacuum was 20 Pa, the argon gas flow rate is 5 cm$^3$/min, and the power is 600 W.

Then, in the step S7, the hardened resist material was peeled off using tweezers, and in the step S8, the cover film 8 was attached.

According to this example, a capacitive sensor sheet in which the variation of the conductive area between the transparent electrode and the supplemental electrode was suppressed is produced.

EXAMPLE 2

Next, the details of the capacitive sensor sheet 1A according to the second embodiment will be described using another example.

Firstly, concrete example of the production method of the capacitive sensor sheet 1A will be described.

Step S1: optically-transparent electroconductive film of which the thickness was 0.1 μm was formed by applying the SEPLEGYDA OC-AE (produced by Shin-Etsu Polymer co., ltd., product name) consisting of polythiophene conductive polymer using gravure printing and drying on one surface of a 50 μm PET sheet.

Step S3 and step S4: the supplemental electrode and the wire were formed to a thickness of about 15 μm at the same time on the optically-transparent electroconductive film by screen printing using the conductive paste containing metallic silver particles.

Step S15: electrode region (10 mm×100 mm) was set on an area which covers part of the optically-transparent electroconductive film and supplemental electrode, and transparent resin containing ink was applied on the electrode region by screen printing. Then, the ink was dried by heating and turned into an optically-transparent resist. The thickness of the optically-transparent resist was 7 μm.

Step S6: Using a SPC-100 produced by HITACHI High Technologies co., ltd. as the plasma etching machine, etching was performed under the condition that the etching gas was oxide. In this example, transparent electrode of 10 mm×100 mm will be formed on the substrate after the etching.

Step S8: after attaching the PET cover film with acrylic adhesive, connecting pads were formed at the terminal of the wire by screen printing using the conductive paste containing carbon particle, and the capacitive sensor sheet were produced.

In this example, as is shown in TABLE 1, plurality capacitive sensor sheets in which the main components of the transparent resin used in the step S15 differ each other were produced. Moreover, an environmental test was performed using the standard that is shown in the following TABLE 2, and the electric resistance and optical characteristics of these capacitive sensor sheets were evaluated. The capacitive sensor sheet which comprises the optically-transparent resist having ultraviolet curable acrylic resin as the main component is produced as a comparative example, and was evaluated in the same manner as the present examples.

The environmental test was performed by placing the capacitive sensor sheets under the condition of 60° C. and 95% RH for 500 hours.

Electric resistance of the capacitive sensor sheets in the longitudinal direction was measured using digital multi meter for evaluation. Both the total light transmittance and the haze were measured by a haze-meter NDH500 produced by NIPPON DENSHOKU INDUSTRIES Co., Ltd. for evaluation.

The following TABLE 1 shows the result of determination for the above example and comparative example. The following TABLE 2 shows determination criteria for the above described evaluation.

TABLE 1

| | Main component of the optically-transparent resist | Type of curing | Early phase after manufacturing of the sensor | | | After the environmental test | | |
|---|---|---|---|---|---|---|---|---|
| | | | Electric resistance | total light transmittance | haze | Electric resistance | total light transmittance | haze |
| Example 1 | polyester | Thermo-setting | A | A | A | A | A | A |
| Example 2 | polyesterpolyurethane | Solvent evaporation-drying | A | A | B | A | A | B |
| Example 3 | urethane | Thermo-setting | A | A | B | A | A | B |
| Example 4 | acrylic | Solvent evaporation-drying | A | A | B | A | A | B |
| Example 5 | vinyl | Solvent evaporation-drying | A | A | A | A | C | B |
| Comparative example | acrylic | Ultraviolet curing | A | A | A | C | A | A |

TABLE 2

| | rating | | |
|---|---|---|---|
| | A | B | C |
| Electric resistance (kΩ) | less than 10 | 10 to 20 | more than 20 |
| total light transmittance (%) | more than 80 | 75 to 80 | less than 75 |
| haze (%) | less than 10 | 10 to 20 | more than 20 |

As is shown in TABLE 1, the examples 1 to 4 did not show the typical change in the electric resistance, the total light transmittance and the haze in comparison with the results of early phase after manufacturing of the sensor and the results after the environmental test. In example 5, although the total light transmittance was worsened by yellowing, the electrical resistance was maintained the same as the early phase.

In comparative example, the electrical resistance after the environmental test was higher than the electrical resistance of the early phase, and may cause an adverse effect on the sensitivity of the sensor. The reason for the rising of electrical resistance is believed to be that the speed of the remaining monomer entering into the conductive polymer layer was accelerated.

About the polyesterpolyurethane (Solvent evaporation-drying type), urethane (Thermo-setting type), and acrylic (Solvent evaporation-drying type), only the haze was high at the early phase, both the rising of the electrical resistance (in view of function) and the reducing of the total light transmittance by yellowing did not occur.

While the embodiments of the present invention have been described above with reference to the drawings, a concrete configuration is not limited to the embodiments and various variations without departing from the scope and spirit of the present invention fall within the present invention. For example, an electrode which is electrically connected with the supplemental electrode may be further provided at the side wall of the transparent electrode. That electrode may be formed by applying the silver paste on the side wall of the transparent electrode after the step of removing the optically-transparent electroconductive film. In this case, the conductive area which is larger than the capacitive sensor sheets of the above-described embodiments can be obtained.

In another case, the transparent electrode may be colored when the transparent electrode has optical transparency.

In another case, plasma etching is described as the method for removing the thin film of SEPLEGYDA (trademark) in the above described embodiment, but the method for removing the thin film of SEPLEGYDA (trademark) is not limited to the plasma etching. For example, chemical etching is available, and mechanically removing of the thin film of SEPLEGYDA (trademark) is also available.

In another case, the components shown in above described embodiment may be used for appropriate combination.

For example, a laminated body of the substrate and the transparent electrode described in the third embodiment may be laminated along the thickness direction thereof. In this case, each transparent electrode may be formed so as to extend in the direction crossing each other between one layer and another layer.

In another case, instead of the configuration in which the transparent electrodes are formed on both surface of the substrate as described in the fourth embodiment, the configuration in which a plurality of laminate bodies described above have been overlapped with each other may be employed.

INDUSTRIAL APPLICABILITY

The capacitive sensor sheet according to the invention may be used suitably for the touch panel and tablet device. In particular, the capacitive sensor sheet according the invention may be used for the touch panel and tablet device illuminated by the illumination light to penetrate a seat-shaped capacitance sensor.

REFERENCE SIGNS LIST 1, 1A, 1B, 1C capacitive sensor sheet
2 substrate
3 transparent electrode
3a electrode region
4, 4A, 4B signal line
4a supplemental electrode
4b wire
5 connecting pad
6 first layer
7 second layer
8 cover film
9 resin film
10 adhesive
11 thin film
12 resist
12A optically-transparent resist
13 connecting pad

The invention claimed is:

1. A production method of a capacitive sensor sheet, the production method comprising:
a film forming step of forming an optically-transparent electroconductive film on at least one surface of a substrate having optical transparency;
a supplemental electrode and a wire forming step of setting an electrode region which functions as a transparent electrode at least in part of the optically-transparent electroconductive film, by laminating a layer which is part of a supplemental electrode to cover at least part of a periphery of the electrode region, the supplemental electrode having a lower electrical resistance than the electrical resistance of the optically-transparent electroconductive film on top of the optically-transparent electroconductive film, and laminating the layer which is part of a wire in which one end thereof is connected to the supplemental electrode on the optically-transparent electroconductive film;
a resist laminating step of laminating a resist to cover all of the electrode region and at least part of the supplemental electrode; and
an electroconductive film removing step of removing, by plasma etching, a part of the optically-transparent electroconductive film formed on the substrate at a position of the electroconductive film not overlapped by the resist, the supplemental electrode and the layer,
wherein the optically-transparent electroconductive film overlapped by the layer has the same pattern as the layer after the plasma etching of the electroconductive film removing step.

2. The production method of a capacitive sensor sheet according to claim 1, further comprising:
a resist removing step of removing the resist after the electroconductive film removing step.

3. The production method of a capacitive sensor sheet according to claim 1, wherein the resist laminating step comprises laminating an optically-transparent resist as the resist.

4. The production method of a capacitive sensor sheet according to claim 3, wherein the transparent electrode is thinner than either of the optically-transparent resist and the supplemental electrode.

5. The production method of a capacitive sensor sheet according to claim 1, wherein the optically-transparent electroconductive film is made of a conductive polymer including at least one of polypyrrole, poly-N-methylpyrrole, poly-3-methylthiophene, poly-3-methoxythiophene, and poly-3,4-ethylenedioxythiophene.

6. The production method of a capacitive sensor sheet according to claim 1, wherein the optically-transparent electroconductive film is formed to have a predetermined thickness of 0.05 μm to 5 μm in the film forming step.

7. The production method of a capacitive sensor sheet according to claim 1, wherein the optically-transparent electroconductive film is formed to have a predetermined thickness of 0.1 μm to 1 μm in the film forming step.

8. The production method of a capacitive sensor sheet according to claim 1, wherein the layer and the supplemental electrode are made from at least one of an ink, carbon, and graphite, the ink containing a metallic particle of at least one of silver, copper, and gold.

* * * * *